United States Patent
Parikh et al.

(10) Patent No.: US 9,224,671 B2
(45) Date of Patent: Dec. 29, 2015

(54) III-N DEVICE STRUCTURES AND METHODS

(71) Applicant: Transphorm Inc., Goleta, CA (US)

(72) Inventors: Primit Parikh, Goleta, CA (US); Yuvaraj Dora, Goleta, CA (US); Yifeng Wu, Goleta, CA (US); Umesh Mishra, Montecito, CA (US); Nicholas Fichtenbaum, Newbury Park, CA (US); Rakesh K. Lal, Isla Vista, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/522,154

(22) Filed: Oct. 23, 2014

(65) Prior Publication Data

US 2015/0041861 A1    Feb. 12, 2015

Related U.S. Application Data

(60) Continuation of application No. 14/102,750, filed on Dec. 11, 2013, now Pat. No. 8,895,421, which is a division of application No. 13/019,733, filed on Feb. 2, 2011, now Pat. No. 8,643,062.

(51) Int. Cl.
*H01L 29/66* (2006.01)
*H01L 29/423* (2006.01)
(Continued)

(52) U.S. Cl.
CPC ............ *H01L 23/34* (2013.01); *H01L 21/0254* (2013.01); *H01L 21/02118* (2013.01);
(Continued)

(58) Field of Classification Search
CPC . H01L 23/24; H01L 23/3732; H01L 23/3738; H01L 21/486; H01L 21/0245; H01L 21/76245; H01L 29/30; H01L 29/1608; H01L 29/66431; H01L 29/7787
USPC ............ 257/79, 190, 192, 194, 778, E27.012, 257/E29.249, E29.317, E21.407, E21.451; 438/167, 172, 571, 667, 712
See application file for complete search history.

(56) References Cited

U.S. PATENT DOCUMENTS

| 4,300,091 A | 11/1981 | Schade, Jr. |
| 4,532,439 A | 7/1985 | Koike |

(Continued)

FOREIGN PATENT DOCUMENTS

| CN | 1748320 | 3/2006 |
| CN | 101107713 | 1/2008 |

(Continued)

OTHER PUBLICATIONS

Authorized officer Chung Keun Lee, International Search Report and Written Opinion in PCT/US2008/076030, mailed Mar. 23, 2009, 10 pages.

(Continued)

*Primary Examiner* — Dao H Nguyen
(74) *Attorney, Agent, or Firm* — Fish & Richardson P.C.

(57) ABSTRACT

A III-N device is described with a III-N layer, an electrode thereon, a passivation layer adjacent the III-N layer and electrode, a thick insulating layer adjacent the passivation layer and electrode, a high thermal conductivity carrier capable of transferring substantial heat away from the III-N device, and a bonding layer between the thick insulating layer and the carrier. The bonding layer attaches the thick insulating layer to the carrier. The thick insulating layer can have a precisely controlled thickness and be thermally conductive.

22 Claims, 13 Drawing Sheets

(51) Int. Cl.
  *H01L 29/12*   (2006.01)
  *H01L 21/18*   (2006.01)
  *H01L 23/34*   (2006.01)
  *H01L 29/10*   (2006.01)
  *H01L 29/16*   (2006.01)
  *H01L 29/20*   (2006.01)
  *H01L 29/778*  (2006.01)
  *H01L 21/02*   (2006.01)
  *H01L 21/48*   (2006.01)
  *H01L 21/762*  (2006.01)
  *H01L 29/30*   (2006.01)
  *H01L 23/373*  (2006.01)

(52) U.S. Cl.
  CPC ........ *H01L21/486* (2013.01); *H01L 21/76254* (2013.01); *H01L 29/1075* (2013.01); *H01L 29/1608* (2013.01); *H01L 29/2003* (2013.01); *H01L 29/30* (2013.01); *H01L 29/66431* (2013.01); *H01L 29/778* (2013.01); *H01L 29/7787* (2013.01); *H01L 23/3732* (2013.01); *H01L 23/3738* (2013.01); *H01L 2924/0002* (2013.01)

(56) References Cited

U.S. PATENT DOCUMENTS

| | | |
|---|---|---|
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Walukiewicz et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,488,992 B2 | 2/2009 | Robinson |
| 7,501,669 B2 | 3/2009 | Parikh et al. |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,642 B2 | 9/2010 | Suh et al. |
| 7,812,369 B2 | 10/2010 | Chini et al. |
| 7,855,401 B2 | 12/2010 | Sheppard et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,914 B2 | 1/2011 | Sheppard |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 * | 3/2011 | Suh et al. ............... 257/194 |
| 7,915,644 B2 | 3/2011 | Wu et al. |
| 7,919,791 B2 | 4/2011 | Flynn et al. |
| 7,928,475 B2 | 4/2011 | Parikh et al. |
| 7,948,011 B2 | 5/2011 | Rajan et al. |
| 7,955,918 B2 | 6/2011 | Wu et al. |
| 7,960,756 B2 | 6/2011 | Sheppard et al. |
| 7,965,126 B2 | 6/2011 | Honea et al. |
| 7,985,986 B2 | 7/2011 | Heikman et al. |
| 7,985,987 B2 | 7/2011 | Kaneko |
| 8,049,252 B2 | 11/2011 | Smith et al. |
| 8,093,606 B2 | 1/2012 | Sonobe et al. |
| 8,237,196 B2 | 8/2012 | Saito |
| 8,237,198 B2 | 8/2012 | Wu et al. |
| 8,389,975 B2 | 3/2013 | Kikuchi et al. |
| 8,390,000 B2 * | 3/2013 | Chu et al. ............... 257/76 |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,525,231 B2 | 9/2013 | Park et al. |
| 8,598,937 B2 | 12/2013 | Lal et al. |
| 8,603,880 B2 | 12/2013 | Yamada |
| 8,643,062 B2 | 2/2014 | Parikh et al. |
| 8,652,948 B2 | 2/2014 | Horie et al. |

(56) References Cited

U.S. PATENT DOCUMENTS

| | | |
|---|---|---|
| 8,716,141 B2 | 5/2014 | Dora et al. |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0003724 A1 | 1/2003 | Uchiyama et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0119067 A1 | 6/2004 | Weeks, Jr. et al. |
| 2004/0164347 A1 | 8/2004 | Zhao et al. |
| 2005/0001235 A1 | 1/2005 | Murata et al. |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2005/0274977 A1 | 12/2005 | Saito et al. |
| 2005/0274980 A1 | 12/2005 | Miyoshi |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0145189 A1 | 7/2006 | Beach |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0226442 A1 | 10/2006 | Zhang et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0249119 A1 | 10/2007 | Saito |
| 2007/0278518 A1 | 12/2007 | Chen et al. |
| 2007/0295985 A1 | 12/2007 | Weeks et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0272397 A1 | 11/2008 | Koudymov et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1* | 3/2009 | Honea et al. ............... 257/192 |
| 2009/0072240 A1 | 3/2009 | Suh et al. |
| 2009/0072269 A1* | 3/2009 | Suh et al. ............... 257/136 |
| 2009/0072272 A1 | 3/2009 | Suh et al. |
| 2009/0075455 A1 | 3/2009 | Mishra |
| 2009/0085065 A1 | 4/2009 | Mishra et al. |
| 2009/0121775 A1 | 5/2009 | Ueda et al. |
| 2009/0140262 A1 | 6/2009 | Ohki et al. |
| 2009/0146185 A1 | 6/2009 | Suh et al. |
| 2009/0191674 A1 | 7/2009 | Germain et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0187570 A1 | 7/2010 | Saxler et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0264461 A1 | 10/2010 | Rajan et al. |
| 2011/0006346 A1 | 1/2011 | Ando et al. |
| 2011/0012110 A1 | 1/2011 | Sazawa et al. |
| 2011/0140172 A1* | 6/2011 | Chu et al. ............... 257/194 |
| 2011/0249185 A1 | 10/2011 | Mochizuki et al. |
| 2012/0168822 A1 | 7/2012 | Matsushita |
| 2012/0193677 A1 | 8/2012 | Parikh et al. |
| 2012/0211800 A1 | 8/2012 | Boutros |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0328061 A1 | 12/2013 | Chu et al. |
| 2014/0084346 A1 | 3/2014 | Tajiri |
| 2014/0099757 A1* | 4/2014 | Parikh et al. ............... 438/172 |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |

(56) References Cited

FOREIGN PATENT DOCUMENTS

| WO | WO 2006/114883 | 11/2006 |
|---|---|---|
| WO | WO 2007/077666 | 7/2007 |
| WO | WO 2007/108404 | 9/2007 |
| WO | WO 2008/120094 | 10/2008 |
| WO | WO 2009/005824 | 1/2009 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25 2010, 6 pages.
Authorized officer Chung Keun Lee, International Search Report and Written Opinion in PCT/US2008/076199, mailed Mar. 24, 2009, 11 pages.
Authorized officer Dorothee Millhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothee Miilhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.

Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Sang-Taek Kim, International Search Report and Written Opinion in PCT/US2011/061407, mailed May 22, 2012, 10 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Search Report and Action in TW Application No. 098132132, issued Dec. 6, 2012, 8 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN-GaN HFET with a Field Modulating Plate," IEEE Electron Device Letters, 2003, 24(5):289-291.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Chen et al., "High-performance AlGaN/GaN Lateral Field-effect Rectifiers Compatible with High Electron Mobility Transistors," Applied Physics Letters, 2008, 92, 253501-1-3.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated $p$-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al, "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.

(56) References Cited

OTHER PUBLICATIONS

Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN-GaN Junctions with Ultrathin AlN Interlayers: Expanding Heterojunction Design," Applied Physics Letters, 2002, 80(23):4387-4389.
Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage, " Electronic Letters, 2005, 41(7):449-450.
Lee et al., "Self-aligned Process for Emitter- and Base-regrowth GaN HBTs and BJTs," Solid-State Electronics, 2001, 45:243-247.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride structures," U.S. Appl. No. 60/972,467, filed Sep. 14, 2007, 7 pages.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode $n$-channel GaN MOSFETs Fabricated on $p$-GaN Using $HfO_2$ as Gate Oxide," Electronics Letters, 2007, vol. 43, No. 17, 2 pages.
Suh et al., "High Breakdown Enhancement Mode GaN-based HEMTs with Integrated Slant Field Plate," U.S. Appl. No. 60/822,886, filed Aug. 18, 2006, 16 pages.
Suh et al. "High-Breakdown Enhancement-mode AlGaN/GaN HEMTs with Integrated Slant Field-Plate," Electron Devices Meeting, 2006, IEDM '06 International, 3 pages.
Suh et al., "III-Nitride Devices with Recessed Gates," U.S. Appl. No. 60/972,481, filed Sep. 14, 2007, 18 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Enhancement-mode $Si_3N\_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1MHz,"Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Simin Baharlou, International Preliminary Report on Patentability in PCT/US2011/063975, mailed Jun. 27, 2013, 5 pages.
Authorized officer Lingfei Bai, International Preliminary Report on Patentability in PCT/US2011/061407, mailed Jun. 6, 2013, 7 pages.
Authorized officer Athina Nickitas-Etienne, International Preliminary Report on Patentability in PCT/US2012/027146, mailed Sep. 19, 2013, 9 pages.
Authorized officer Hye Lyun Park, International Search Report and Written Opinion in PCT/US2013/050914, mailed Oct. 18, 2013, 11 pages.
Authorized officer June Young Son, International Search Report and Written Opinion in PCT/US2014/016298, mailed May 23, 2014, 15 pages.

(56) References Cited

OTHER PUBLICATIONS

Authorized officer June Young Son, International Search Report and Written Opinion in PCT/US2014/024191, mailed Aug. 7, 2014, 11 pages.
Authorized officer Sang Won Choi, International Search Report and Written Opinion in PCT/US2013/048275, mailed Oct. 14, 2013, 17 pages.
Authorized officer Tae Hoon Kim, International Search Report and Written Opinion in PCT/US2014/027523, mailed Jul. 30, 2014, 14 pages.
Authorized officer Tae Hoon Kim, International Search Report and Written Opinion in PCT/US2013/035837, mailed Jul. 30, 2013, 9 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
European Search Report in Application No. 10 81 5813.0, mailed Mar. 12, 2013, 9 pages.
Search Report and Action in TW Application No. 098141930, issued Jul. 10, 2014, 7 pages.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Barnett and Shinn, "Plastic and Elastic Properties of Compositionally Modulated Thin Films," Annu. Rev. Mater. Sci., 1994, 24:481-511.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Marchand et al., "Metalorganic Chemical Vapor Deposition on GaN on Si(111): Stress Control and Application to Filed-effect Transistors," Journal of Applied Physics, 2001, 89(12):7846-7851.
Reiher et al., "Efficient Stress Relief in GaN Heteroepitaxy on Si(111) Using Low-temperature AlN Interlayers," Journal of Crystal Growth, 2003, 248:563-567.

* cited by examiner

III-N DEVICE STRUCTURES AND METHODS

CROSS-REFERENCE TO RELATED APPLICATION

This application is a continuation of U.S. application Ser. No. 14/102,750, filed Dec. 11, 2013, which is a divisional of U.S. application Ser. No. 13/019,733, filed Feb. 2, 2011. The entire disclosure of each of the prior applications is hereby incorporated by reference.

TECHNICAL FIELD

This invention relates to semiconductor electronic devices, specifically devices with native substrates removed.

BACKGROUND

Modern power semiconductor devices, such as power MOSFETs, HEMTs, and Insulated Gate Bipolar Transistors (IGBTs), have been typically fabricated with silicon (Si) semiconductor materials. More recently, silicon carbide (SiC) power devices have been developed due to their superior properties. III-N (III-N) semiconductor devices have many potential advantages over silicon and SiC based devices for high power electronics applications, and are now emerging as an attractive candidate to carry large currents, support high voltages, provide very low on resistances, and operate at high voltages with fast switching times.

As large III-N substrates are not yet widely available, III-N semiconductor devices are currently grown by heteroepitaxy on suitable foreign substrates (i.e., substrates that differ substantially in composition and/or lattice structure from that of the deposited layers). Typically, III-N semiconductor devices are grown on silicon, sapphire ($Al_2O_3$), or silicon carbide (SiC) substrates. Techniques for applying the III-N layers can include molecular beam epitaxy (MBE), metal organic chemical vapor deposition (MOCVD), and hydride vapor phase epitaxy (HYPE). Silicon substrates are emerging as a particularly attractive substrate candidate for III-N devices due to their low cost, wide availability, large wafer sizes, thermal properties, and ease of integration with silicon-based electronics. Due to the large lattice mismatch and thermal expansion coefficient mismatch between silicon and III-N materials, III-N device structures typically include nucleation and stress management layers to allow for growth of thick III-N layers.

A typical prior art III-N high electron mobility transistor (HEMT), shown in FIG. 1, includes a foreign substrate 10, such as silicon, a nucleation layer 9 atop the substrate, such as AlN or $Al_xGa_{1-x}N$, a stress management stack 8 atop the nucleation layer, such as AlN/GaN or $Al_xGa_{1-x}N$/GaN superlattices, a channel layer 11, such as a layer of GaN atop the stress management stack 8, and a barrier layer 12, such as a layer of $Al_xGa_{1-x}N$, atop the channel layer. A two-dimensional electron gas (2 DEG) channel 19 (illustrated by a dotted line) is induced in the channel layer 11 near the interface between the channel layer 11 and the barrier layer 12. Source and drain electrodes 14 and 15, respectively, which are formed on opposite sides of the gate electrode 16, contact the 2 DEG channel 19 in channel layer 11. Gate 16 modulates the portion of the 2 DEG in the gate region, i.e., directly beneath gate 16. Insulator layer 13, such as a layer of SiN, atop barrier layer 12, is a surface passivation layer that prevents or suppresses voltage fluctuations at the surface of the barrier layer adjacent to insulator layer 13.

The heteroepitaxial growth or deposition of the III-N epitaxial layers of the device on foreign substrate 10 necessitates the inclusion of intermediate layers between the substrate 10 and the channel layer 11, which include nucleation layer 9 and stress management stack 8, in order to minimize the deleterious effects of the thermal and lattice mismatches between III-N device layers and the foreign substrate 10, such as defect formation and stress in the layers. However, these intermediate layers typically have a high concentration of dislocations, trapping centers, and other defects which can be detrimental to device performance. Such defects can trap charge (i.e., have an electric potential that can attract and bind electrons such that the bound electrons do not contribute to the current in the device or result in instabilities such as threshold voltage fluctuations) while a voltage is applied to the device during operation. The nucleation and stress management layers can therefore cause a difference in current-voltage characteristics from those that would be observed if the device did not contain these layers.

It has been found that the removal of nucleation layer 9 and stress management stack 8, which can be accessed and removed after the removal of the underlying foreign substrate 10, can allow for a device having superior device properties that are very important for high-voltage III-N device applications. The removal of these layers can enable a device to operate at high voltage without being subject to substantial trapping, leakage, or early breakdown effects, thereby being superior compared to III-N devices that have not had their native substrates and stress management layers removed.

SUMMARY

In one aspect, a III-N device is described that includes a III-N layer having an electrode thereon, a passivation layer adjacent the III-N layer and electrode, a thick insulating layer adjacent the passivation layer and electrode, a high thermal conductivity carrier capable of transferring substantial heat away from the III-N device, and a bonding layer between the thick insulating layer and the carrier. The bonding layer attaches the thick insulating layer to the carrier.

For the devices described herein, one or more of the following may be applicable. The thick insulating layer can be at least 1 micron thick. The thick insulating layer can be silicon nitride, aluminum nitride, silicon oxide, alumina, a polymeric dielectric, and an inorganic or an organic dielectric. The thick insulating layer can be polymide, benzocyclobutene (BCB), SU8, or a combination of these dielectrics. The bonding layer can be thermally conductive. The bonding layer can be solder and dielectric glue. The bonding layer can be a metal-based solder. The passivation layer can be silicon nitride, aluminum nitride, silicon dioxide, alumina, a polymeric dielectric, and an inorganic or an organic dielectric. The passivation layer and the thick insulating layer can have substantially the same composition. The combination of the passivation layer and the thick insulating layer can passivate the surface of the III-N layer. The high thermal conductivity carrier can be polycrystalline silicon carbide, silicon, aluminum nitride, a metal or diamond. The high thermal conductivity carrier can be at least 100 microns thick. The III-N device can include a substrate. The substrate can be adjacent the III-N layer. The substrate can be silicon, silicon carbide, sapphire and aluminum nitride. The III-N device can include a nucleation layer between the substrate and the III-N layer. The III-N device can include a stress management layer between the nucleation layer and the III-N layer. The electrode can be a gate and the device can be a transistor. The III-N device can include a source electrode and a channel in the III-N layer, and the source electrode and the drain electrode can contact the channel. The III-N layer can include a channel layer and a barrier layer. The electrode can be an anode or a cathode and the device can be a diode. The diode can be a lateral device.

In some embodiments, the III-N device can include a second dielectric insulating layer between the thick insulating layer and the passivation layer. The second dielectric insulating layer can be silicon nitride, aluminum nitride, silicon oxide, alumina, a polymeric dielectric, and an inorganic or an organic dielectric. The second dielectric insulating layer can be between about 0.5 and 5 microns thick. The thick insulating layer can be at least 1 micron thick. The thick insulating layer can be between about 1 and 50 microns thick. The combined thickness of the thick insulating layer and the second dielectric insulating layer can be sufficient to support substantial operating voltages. The thermal conductivity of the second dielectric insulating layer can be less than the thermal conductivity of the thick insulating layer. The combined thermal conductivity of the thick insulating layer and the second dielectric insulating layer can be sufficient to dissipate substantial heat from the III-N device. The second dielectric insulating layer can be silicon nitride and the thick insulating layer can be aluminum nitride. The high thermal conductivity carrier can be aluminum nitride.

In another aspect, a method of making a III-N device is described. The method includes forming on a substrate a first structure including a III-N device having an electrode and an insulating layer on a surface of the III-N device opposite the substrate. After forming the first structure, a second structure is formed by applying a bonding layer to a high thermal conductivity carrier. The bonding layer of the second structure is bonded to the insulating layer of the first structure.

One or more embodiments of the method can include one or more of the following features. The method can include removing the substrate. A second passivation layer can be deposited on a side of the III-N layer opposite the passivation layer. A via can be formed through the second passivation layer. A conductive material can be deposited in the via.

In another aspect, a III-N device is described that includes a substrate having a thickness, a III-N layer adjacent the substrate, an electrode adjacent the III-N layer on a side opposite the substrate, and an aperture through the entire thickness of the substrate.

For all devices described herein, one or more of the following may be applicable. The substrate can be silicon, silicon carbide, sapphire, and aluminum nitride. The electrode can be a gate, a source, or a drain, and the device can be a transistor. The aperture can be opposite the electrode. The III-N layer can include a channel layer and a barrier layer. The channel layer can be between the barrier layer and the substrate. The channel layer can have a thickness, and the aperture can be through the entire thickness of the substrate but not through the entire thickness of the channel layer. The electrode can be an anode or a cathode and the device can be a diode. The diode can be a lateral device. The III-N device can include a passivation layer in the aperture and contacting the III-N layer. The passivation layer can be between about 0.5 and 20 microns thick. The passivation layer can extend over a side of the substrate opposite the III-N layer. The III-N device can include a thermally conductive layer contacting the passivation layer on a side opposite the III-N layer. The thermally conductive layer can be a heat sink. The thermal conductivity of the passivation layer can be sufficient to dissipate substantial heat from the III-N device. The passivation layer can be silicon nitride, aluminum nitride, silicon dioxide, alumina, a polymeric dielectric, and an inorganic or an organic dielectric. The passivation layer can passivate the surface of the III-N layer adjacent the aperture.

In another aspect, a method of making a III-N device is described. The method includes forming on a substrate, the substrate having a thickness, a structure including a III-N device having an electrode on a surface of the III-N device opposite the substrate. After forming the structure, an aperture is formed through the entire thickness of the substrate.

One or more embodiments of the method can include one or more of the following features. The aperture can be opposite the electrode. A passivation layer can be deposited in the aperture.

Dielectric insulating layers typically need to be made thick to support high electric fields in the dielectric insulating layers during device operation, and typically the thickness of the dielectric insulating layers must be controlled so that the thermal conductivity of the dielectric insulating layers is sufficient to dissipate substantial heat in order to ensure reproducibility of the device breakdown voltage and other device parameters. The techniques described here may result in sufficiently precise control of the thermal conduction in III-N devices, especially when high voltage operation is required, and thus reproducible manufacturing using this process may be possible.

DETAILED DESCRIPTION

Semiconductor devices, such as HEMTs and diodes, are described which can be manufactured reproducibly. One embodiment of the invention is a III-N semiconductor device that includes a substantially thick carrier. The carrier can allow for an additional path of heat dissipation in the device without lowering its breakdown voltage. In one implementation, the substrate on which the device is initially grown or deposited is removed. In this case, the carrier can also provide structural support during the substrate removal process. As used herein, a "substrate" is a semiconductor material layer on top of which further semiconductor material layers of a semiconductor device are deposited, for example, epitaxially grown, such that the crystalline structure of the grown semiconductor material contacting or adjacent to the substrate at least partially conforms to, or is at least partially determined by the crystalline structure of the substrate. As used herein, an "as-grown substrate" is the substrate on which the III-N device is initially deposited. In some implementations, as-grown substrates are removed in their entirety and in some implementations are partially removed.

As used herein the term "device face" means the face of a semiconductor wafer, epitaxial layer, or other layer on which electrodes are formed that make ohmic and/or Schottky and/or metal-insulator-semiconductor (MIS) contact to the device. The "reverse face" is opposite to the device face. For example, in FIG. 1, the device face of the prior art III-N HEMT refers to surface 1 (indicated by an arrow) adjacent to source, drain, and gate electrodes 14, 15, and 16, respectively. The reverse face of the III-N HEMT structure refers to surface 2 (indicated by an arrow) of the bottom of substrate 10.

Figure 2:
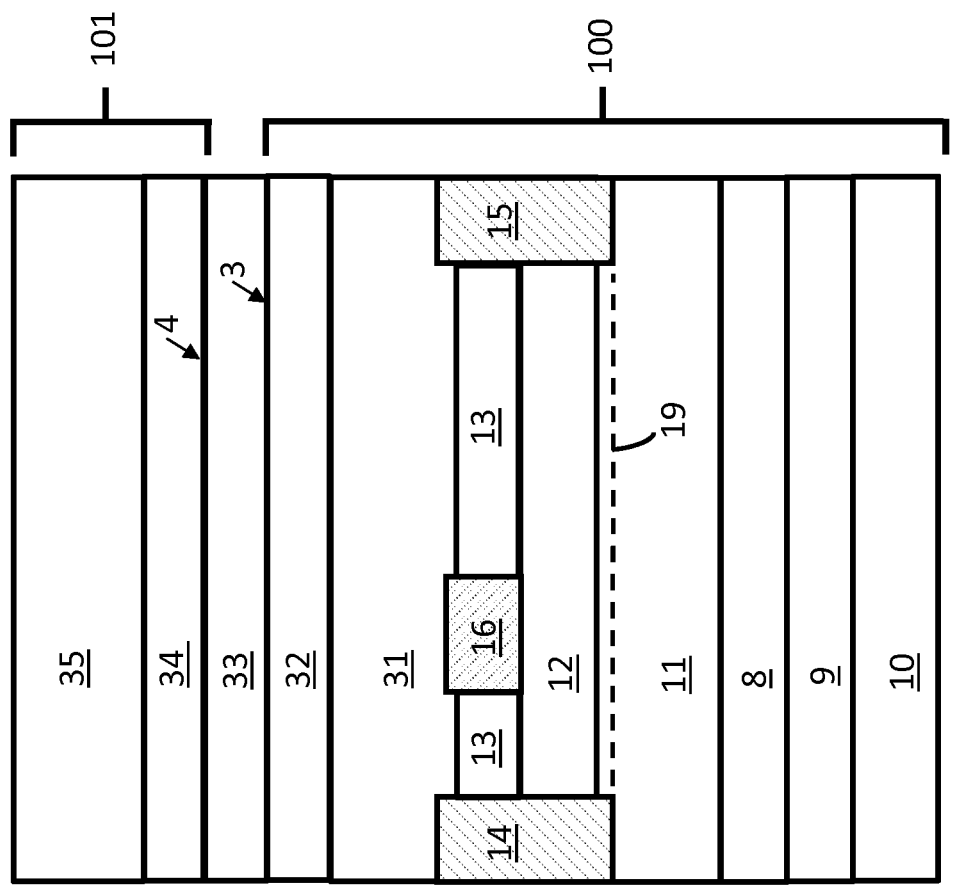
FIG. 2 is a schematic cross-sectional view of a III-N HEMT device containing a dielectric insulating layer, bonding layers, and a thick carrier.

FIG. 2 shows a schematic illustration of a III-N HEMT grown on a foreign substrate. As used herein, the terms III-N or III-Nitride device, material or, layer, refers to a device, material or layer comprised of a compound semiconductor material according to the stoichiometric formula $Al_xIn_yGa_zN$, where x+y+z is about 1. Examples of typical III-N devices that have been fabricated on foreign substrates include High Electron Mobility Transistors (HEMTs), POLFETs, MESFETs, LEDs, Diode Lasers, and Current Aperture Vertical Electron Transistors (CAVETs). The III-N HEMT device in FIG. 2 includes a substrate 10, a nucleation layer 9 atop the substrate, and a stress management stack 8 atop the nucleation layer. III-N layers 11 and 12, which are formed on top of the stress management stack 8, are III-N materials that form the basis for the HEMT device. III-N layers 11 and 12 have different compositions, the compositions chosen such that a 2 DEG channel 19 (illustrated by a dotted line) is induced in layer 11, which is hereby referred to as "channel layer 11". Some or all of the III-N material in layer 12 has a bandgap which is larger than that of channel layer 11, so layer 12 is hereby referred to as "barrier layer 12". For example, channel layer 11 and barrier layer 12 can be GaN and $Al_xGa_{1-x}N$, respectively, where x is between 0 and 1 or equal to 1.

Substrate 10 can include or be formed of silicon, sapphire, AlN, SiC, or another foreign substrate suitable for use in III-N devices. Due to the large lattice mismatch and thermal expansion coefficient mismatch between the foreign substrate 10 and III-N materials, there is typically a high defect concentration and stress in III-N epitaxial layers deposited directly on foreign substrates. Therefore, nucleation layer 9, atop the substrate 10, and stress management stack 8, atop the nucleation layer, are included between channel layer 11 and substrate 10 to minimize the mismatch effects between channel layer 11 and foreign substrate 10, and to allow for growth of III-N device layers with adequately high structural quality.

Figure 1:
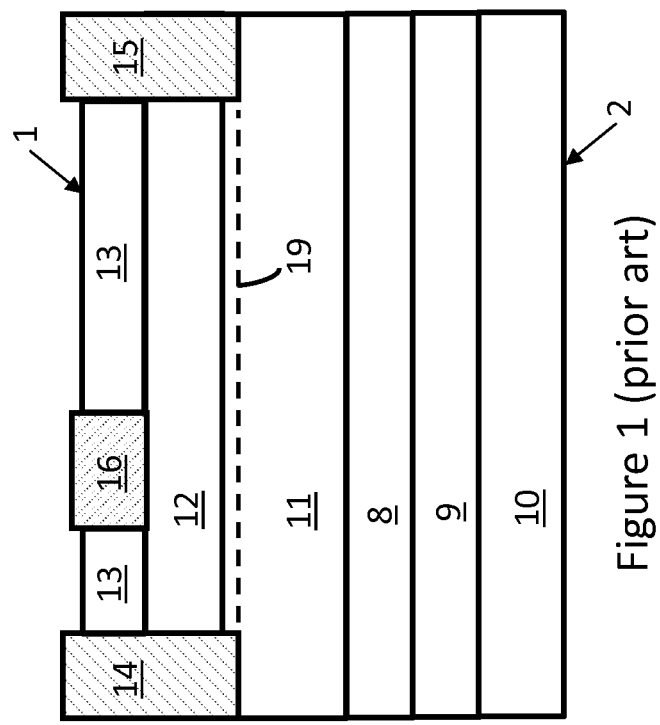
FIG. 1 is a schematic cross-sectional view of a III-N HEMT device of the prior art.

In addition to the layers in the prior art device structure of FIG. 1, the device of FIG. 2 includes a dielectric insulating layer 31, and bonding layers 32, 33, and 34, that are used to attach a thick thermally conductive carrier 35 to dielectric insulating layer 31. Dielectric insulating layer 31 is made of a dielectric material that has substantially the same composition as insulator layer 13. Dielectric insulating layer 31 may be silicon nitride, aluminum nitride, silicon oxide, alumina, a polymeric dielectric, an inorganic or an organic dielectric, or any combination of these dielectric materials. Other examples of dielectrics include polyimide, benzocyclobutene (BCB) or SU8, or a combination of these dielectrics. Dielectrics can be deposited using chemical vapor deposition (CVD), plasma-enhanced chemical vapor deposition (PECVD), atomic layer deposition (ALD), sputtering, spinning, or other methods. Carrier 35 is a thick and thermally conductive carrier, such as polycrystalline silicon carbide (poly-SiC), silicon, aluminum nitride, a metal, or diamond, and can serve as an additional path of heat dissipation in the device without lowering its breakdown voltage, as compared to the device shown in FIG. 1 which does not include carrier 35. The method of attaching carrier 35 to dielectric insulating layer 31 using bonding layers 32, 33, and 34, is described below.

Dielectric insulating layer 31 should be sufficiently thermally conductive to dissipate substantial heat generated at the voltages at which the III-N device operates. The layer should dissipate enough heat so as not to degrade the device, and further, so that the device is sufficiently operational. The device is sufficiently operational if the device temperature doesn't exceed the maximum temperature for which the device is rated in the application for which it is being used.

Dielectric insulating layer 31 in combination with insulator layer 13 maintains effective passivation of the uppermost surface of the device, i.e., the surface of barrier layer 12. As used herein, a "passivation layer" refers to any layer or combination of layers grown or deposited on a surface of a III-N layer in a III-N device which can prevent or suppress voltage fluctuations at that surface during device operation. Dielectric insulating layer 31 in combination with insulator layer 13 can be an effective passivation layer since both these layers are formed from dielectric materials that, when deposited on barrier layer 12, create few surface states on the uppermost portion of barrier layer 12 or prevent surface states on the uppermost portion of barrier layer 12 from being electrically active, and have low trap density, which can adequately prevent or suppress the surface/interface states from trapping charge during device operation.

The dielectrics that serve as effective passivation layers for the uppermost III-N surface of the device may not have as high thermal conductivity as other dielectrics which are not effective for passivating the III-N surface. For example, SiN has a lower thermal conductivity than AlN, however, it may be more effective than AlN for passivating the uppermost surface of the III-N device. Therefore the thickness of dielectric insulating layer 31 can be chosen such that it is capable of dissipating enough heat during device operation to support the operating voltage without the device breaking down. If dielectric insulating layer 31 is too thick, the layer may not be capable of dissipating enough heat during device operation, which may result in undesirable device performance, such as early breakdown, and poor device reliability. Accordingly, dielectric insulating layer can be less than 20 microns, such as between 3 and 20 microns or between 5 and 20 microns. On the other hand, if it is too thin, the resulting electric fields in the dielectric insulating layer 31 may be too large during device operation, causing the dielectric material to break down, as described below.

Dielectric insulating layer 31 can also be sufficiently thick to support the electric fields present in the layer during device operation. In some implementations, carrier 35 may be attached to a ground plane or other heat sink during device operation, or the carrier 35 or bonding layers 32-34 may be electrically conductive, which can modify and enhance the electric fields present in dielectric insulating layer 31. Therefore, dielectric insulating layer 31 can be thick enough to ensure that the electric fields in the dielectric insulating layer 31 do not exceed the breakdown fields of the dielectric material.

Accordingly, the thickness of dielectric insulating layer 31 can be about 1 micron or thicker, such as between about 1 micron and 20 microns. The thickness of dielectric insulating layer 31 that can be required depends on the operating voltage (i.e., the maximum voltage difference between the source and drain during operation) of the device. For example, for operation up to about 100 V, the thickness can be about 1 micron or thicker, for operation up to about 300 V, the thickness can be about 2 microns or thicker, for operation up to about 600 V, the thickness can be about 3 microns or thicker, for operation up to about 1200 V, the thickness can be about 6 microns or thicker, and for operation up to about 1700 V, the thickness can be about 10 microns or thicker, such as between about 10 and 20 microns. Dielectric insulating layer 31 in combination with insulator layer 13 is substantially thicker than in the conventional prior art device of FIG. 1 that does not include the dielectric insulating layer 31. The combined layers provide high enough breakdown strength to support high electric fields during device operation while simultaneously serving as a passivation layer for the device.

Figure 3:
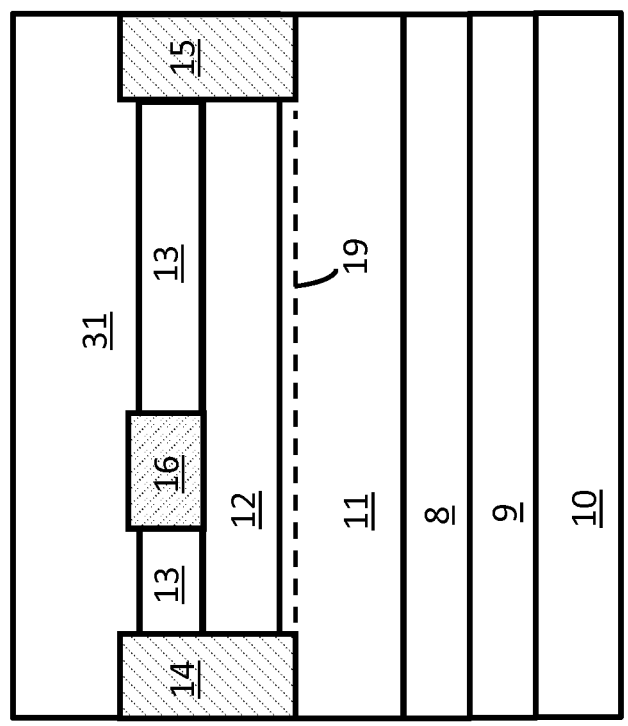
FIGS. 3-5 illustrate a method of forming the III-N HEMT device of FIG. 2.
Figure 4:
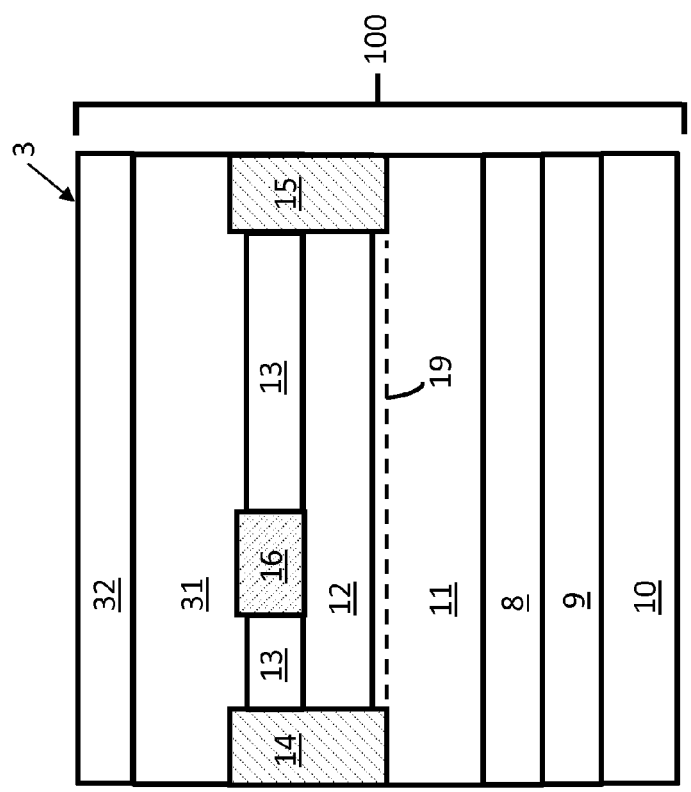
Figure 5:
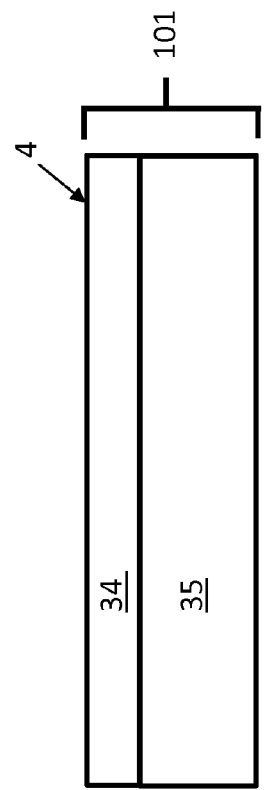

A method of forming the device of FIG. 2 is illustrated in FIGS. 3-5. Referring to FIG. 3, dielectric insulating layer 31 is grown or deposited over the entire device structure of FIG. 1. Dielectric insulating layer 31 can be grown or deposited by methods such as MOCVD, PECVD, high temperature CVD (HTCVD), sputtering, evaporation, or another method.

Referring to FIG. 4, a bonding layer 32, that can be an adhesive material such as titanium, platinum, gold, or other material, is deposited over dielectric insulating layer 31. The structure 100 shown in FIG. 4 includes the III-N device of FIG. 3 and bonding layer 32. Surface 3 (indicated by an arrow) is the surface of the device face of structure 100.

Referring to FIG. 5, a second bonding layer 34, such as titanium, platinum, gold, or other adhesive material, is deposited over a thick thermally conductive carrier 35, which may be poly-SiC, silicon, AlN, a metal, or diamond, to form structure 101. Surface 4 (indicated by an arrow) is the surface of structure 101, i.e., the surface of second bonding layer 34 that is on the side of bonding layer 34 opposite the carrier 35.

To form the structure shown in FIG. 2, the structure 101 can be flipped upside down and its surface 4 attached to surface 3 of structure 100 using an intermediate bonding layer 33, such as a solder preform or other material, to bond surface 3 of structure 100 to surface 4 of structure 101.

In some embodiments, the as-grown substrate 10, nucleation layer 9, and stress management stack 8 are removed from the III-N device structure of FIG. 2. In that case, thick carrier 35 not only dissipates heat from the structure, but also provides mechanical support to the structure during the substrate removal process described below. In this case, carrier 35 typically must be substantially thicker than the III-N layers, and as a result can provide rigidity and mechanical support to the device during the substrate removal process. For example, carrier 35 can be 100 microns or thicker, 300 microns or thicker, or 500 microns or thicker.

Figure 6:
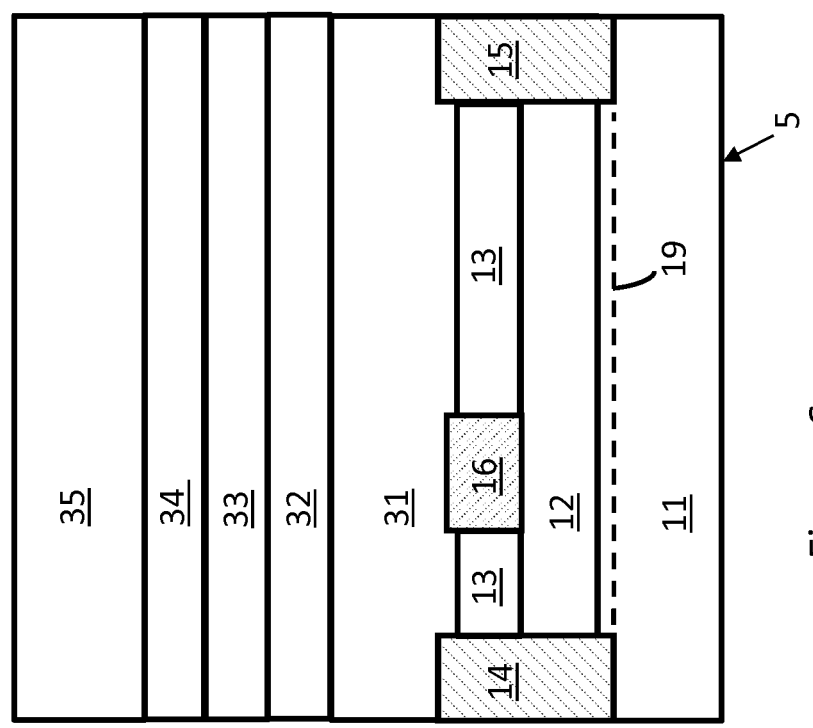
FIGS. 6 and 7 are schematic cross-sectional views of a III-N HEMT device with its as-grown substrate, nucleation layer, and stress management layers removed.

FIG. 6 shows the structure of FIG. 2 with the as-grown substrate 10, nucleation layer 9, and stress management stack 8 removed. An example of the process for removing these layers is as follows. The as-grown substrate 10, shown in FIG. 2, is thinned to below 100 micrometers by lapping or by using a fast, coarse etch. After thinning, the remaining portion of the as-grown substrate 10, the nucleation layer 9, and the stress management stack 8 can be removed by etching, such as by wet etching, by fluoride-based plasma etching, by chlorine-based plasma etching, or by any other process that does not introduce substantial defects. As shown in FIG. 6, surface 5 (indicated by an arrow) of channel layer 11 on the reverse face of the III-N device is exposed after the removal of the as-grown substrate 10, nucleation layer 9, and stress management stack 8, all shown in FIG. 2.

Figure 7:
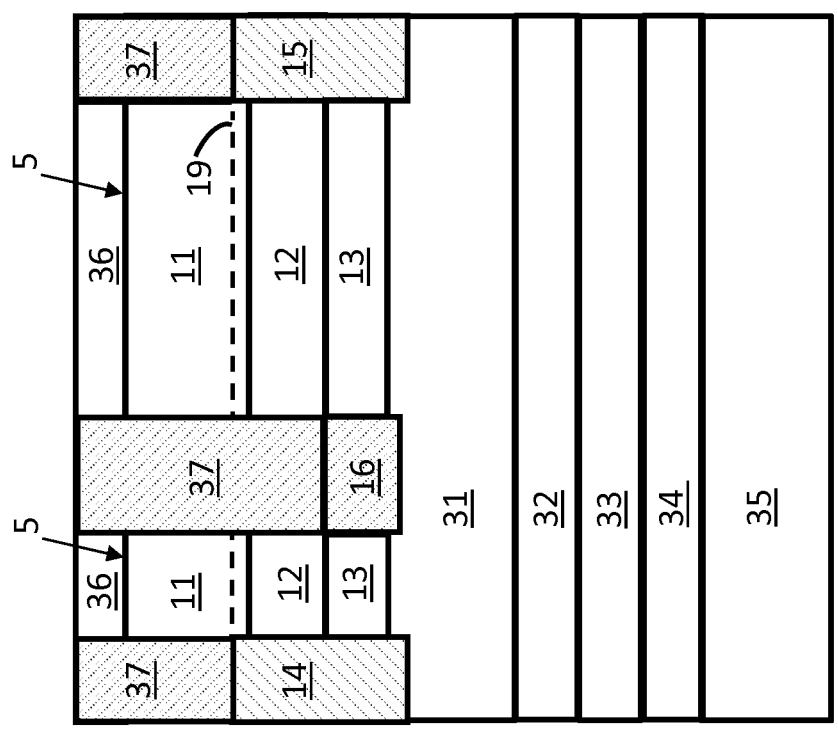

As shown in FIG. 7, the device is turned upside down, and a reverse side passivation layer 36, such as silicon nitride, aluminum nitride, silicon oxide, or other material is deposited on the exposed surface 5 of channel layer 11. Then vias are formed through the reverse side passivation layer 36, and channel layer 11, and, in the case of the via which connects to gate electrode 16, through barrier layer 12, to reach the source, drain, and gate electrodes 14, 15, and 16, respectively. The vias are then filled with a conducting material 37, which contact the electrodes below, to create electrical contacts for the device that are accessible on the reverse face (now the top face of the device in FIG. 7).

In some III-N device implementations, when dielectric insulating layer 31 is made thick enough to prevent electric fields in the layer from becoming too large, it may in fact be too thick to provide sufficient thermal conduction to dissipate enough heat for the device to be sufficiently operational at high operating voltages. In these applications, the dielectric insulating layer 31 can be replaced with multiple dielectric layers, such that the average thermal conductivity per unit volume of the combined dielectric layers is greater than that of dielectric insulating layer 31 on its own.

Figure 8:
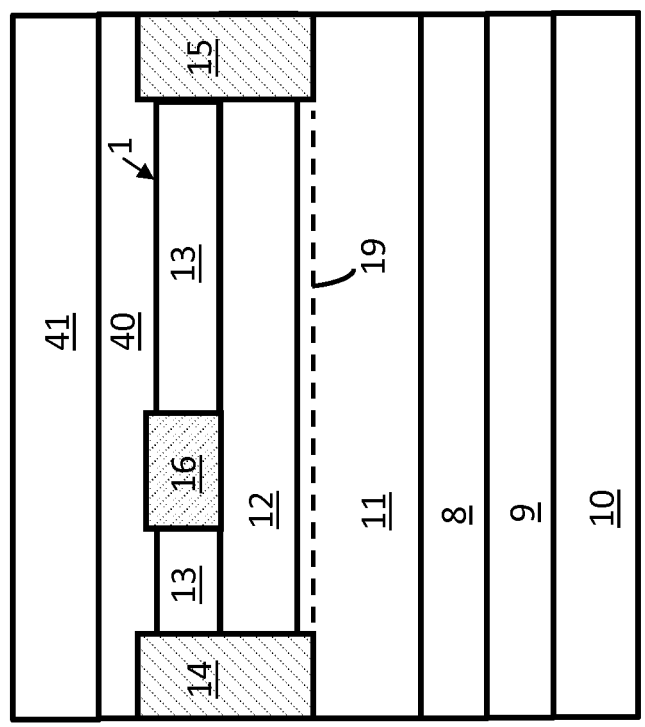
FIG. 8 is a schematic cross-sectional view of a III-N HEMT device containing two dielectric insulating layers.

FIG. 8 shows a schematic illustration of a III-N HEMT device that includes two dielectric layers atop the prior art device structure of FIG. 1, rather than the single dielectric insulating layer 31 shown in FIG. 3. The first dielectric insulating layer 40, such as silicon nitride, is deposited over surface 1 on the device face of the structure, after which a second dielectric insulating layer 41 such as aluminum nitride, with a higher thermal conductivity than that of the first dielectric insulating layer 40, is deposited over the first dielectric insulating 40. The first dielectric insulating layer 40, in combination with insulator layer 13, can effectively passivate the underlying III-N surface. If the second dielectric insulating layer 41 were to be deposited directly on the uppermost surface of the III-N device or directly on top of insulator layer 13 without the inclusion of the first dielectric insulating layer 40, there may not be effective passivation of the uppermost III-N surface of the device. The first dielectric insulating layer 40 can be thin, such as about 0.5 microns, or between about 0.5 microns and 5 microns. The second dielectric insulating layer 41 can be about 1 micron or thicker, such as between about 1 micron and 10 microns, or between about 1 micron and 20 microns, or between about 1 micron and 50 microns. Dielectric insulating layer 40 can be made thin compared to dielectric insulating layer 41 in order to maximize thermal conductivity of the combined layers. The combined thickness of the first dielectric insulating layer 40 and second dielectric insulating layer 41 can be large enough to support substantial operating voltages, while at the same time the layers can have a high enough average thermal conductivity so that the combined layers are capable of dissipating sufficient heat from the device.

Figure 9:
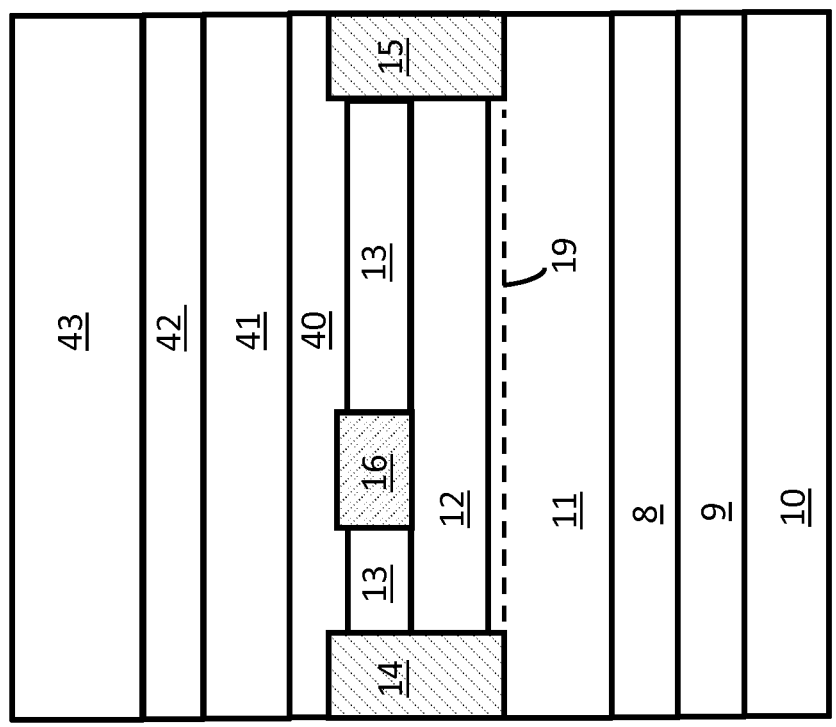
FIG. 9 is a schematic cross-sectional view of a III-N HEMT device containing two dielectric insulating layers, a bonding layer, and a thick carrier.

Referring to FIG. 9, a thick carrier 43, such as AlN, silicon, metal, SiC, or diamond, is deposited upon the second dielectric insulating layer 41 using an appropriate intermediate adhesive layer 42, such as solder, dielectric glue, or other bonding material. It is desirable that the adhesive layer 42 be thermally conductive to minimize any increase in thermal resistance of the device. For example, metal-based solder may have higher thermal conductivity than dielectric glue, and as a result may be more thermally conductive and therefore a more desirable material to use.

Figure 10:
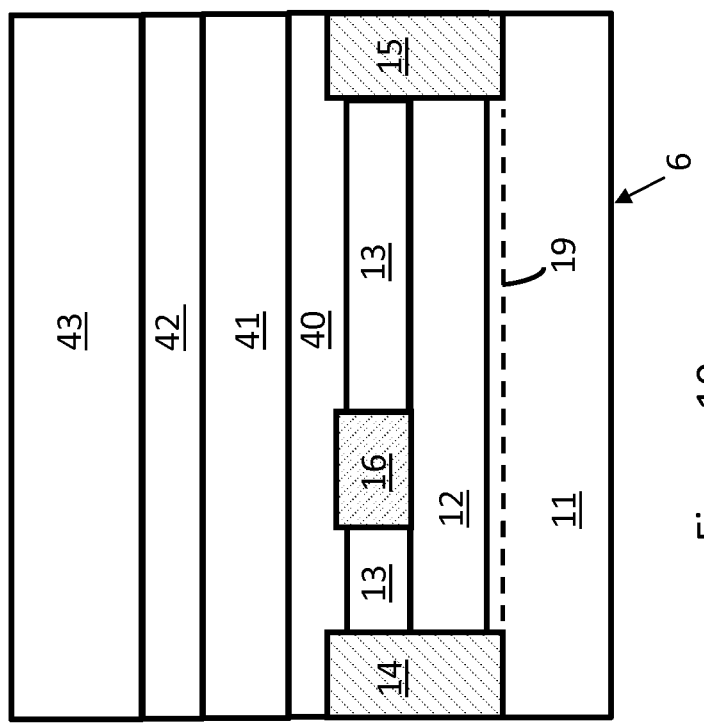
FIGS. 10 and 11 are schematic cross-sectional views of a III-N HEMT device with its as-grown substrate, nucleation layer, and stress management layers removed.
Figure 11:
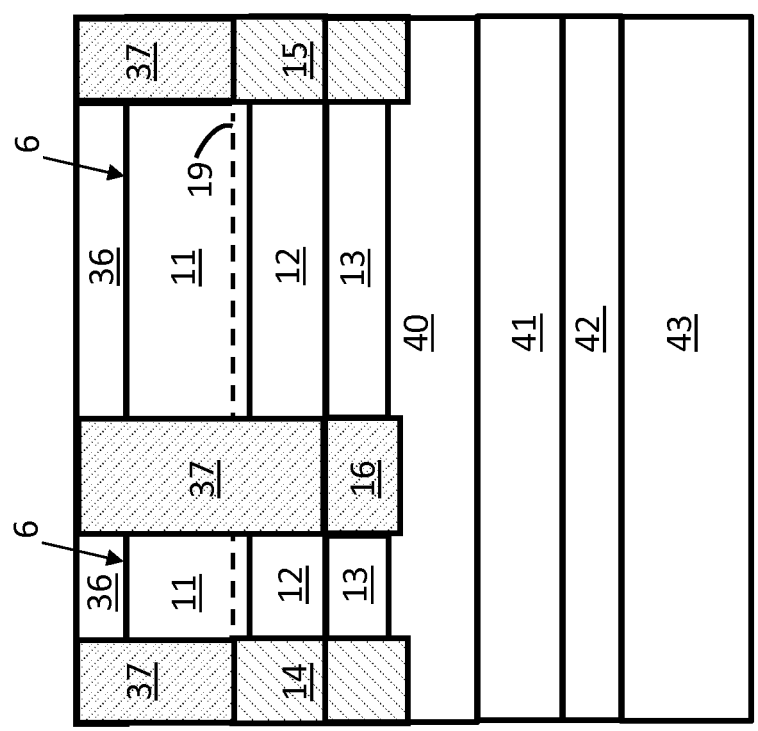

FIG. 10 shows the III-N device structure of FIG. 9, with its as-grown substrate 10, nucleation layer 9, and stress management stack 8 removed. After the removal of these layers, surface 6 (indicated by an arrow) of channel layer 11 on the reverse face of the III-N device is exposed. As shown in FIG. 11, a reverse side passivation layer 36, such as silicon nitride, aluminum nitride, silicon oxide, or other material is deposited on the exposed surface 6, and conductive vias are formed through the reverse side passivation layer 36 to reach the source, drain, and gate electrodes 14, 15, and 16, respectively. The vias are then filled with a conducting material 37, which contact the electrodes below, to create electrical contacts for the device accessible on the reverse face of the III-N device.

As compared to the device of FIG. 7, with a single dielectric insulating layer 31, the use of two dielectric insulating layers 41 and 42 in the device of FIG. 11 can further increase thermal energy dissipation from the III-N device during device operation, thereby further increasing device performance and reliability as compared to the device of FIG. 7 with only a single dielectric.

The III-N devices shown in FIGS. 7 and 11 with their as-grown substrates removed necessitate the inclusion of a carrier that is sufficiently thermally conductive to dissipate the heat required for high voltage device operation without early breakdown as described above. In some implementations, it may be desirable to only partially remove the as-grown substrate on which a III-N device is formed, rather than to remove it in its entirety. In that case, the III-N device may not need to include a carrier, since the portions of the as-grown substrate that are retained can provide the thermal conductance required for heat dissipation at high voltage operation. Removing portions of the as-grown substrate can reduce parasitic components of the device while still allowing for the remaining portions of the as-grown substrate to provide structural support for the device, as well as heat dissipation during device operation. III-N devices that are formed on conductive substrates, such as silicon, include parasitic capacitances which can make the devices susceptible to premature breakdown and degrade high-frequency device performance. The partial removal of as-grown substrates in III-N devices, particularly in regions in which these parasitic capacitances can be the most substantial, can reduce the overall parasitics in the device, thus enhancing the breakdown voltage and improving high-frequency device performance.

Figure 12:
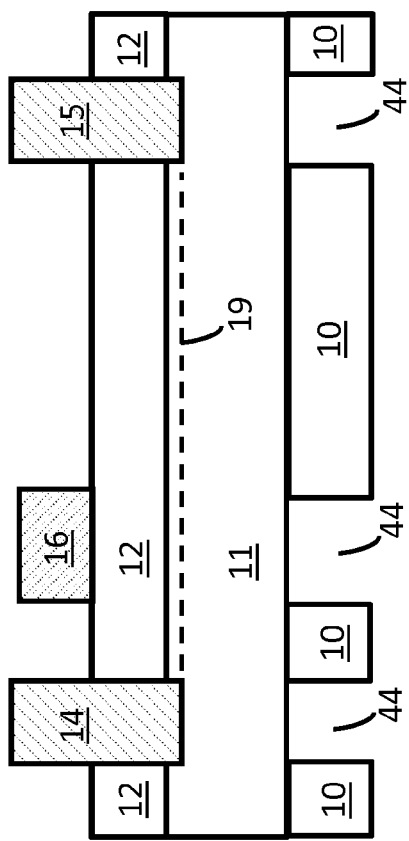
FIGS. 12-14 are schematic cross-sectional views of a III-N HEMT device with its as-grown substrate partially removed.

FIG. 12 shows a III-N HEMT device with portions of the substrate 10 removed in the regions 44 below and around the device electrodes, including source electrode 14, drain electrode 15, and gate electrode 16. Parasitic capacitances are the most substantial in these regions, since the distance separating two conductive materials, i.e., the conductive substrate 10 and the electrodes, is minimum in regions 44. Therefore it can be advantageous to remove the substrate below and around the electrodes to eliminate or reduce the parasitic capacitances in these regions.

Figure 13:
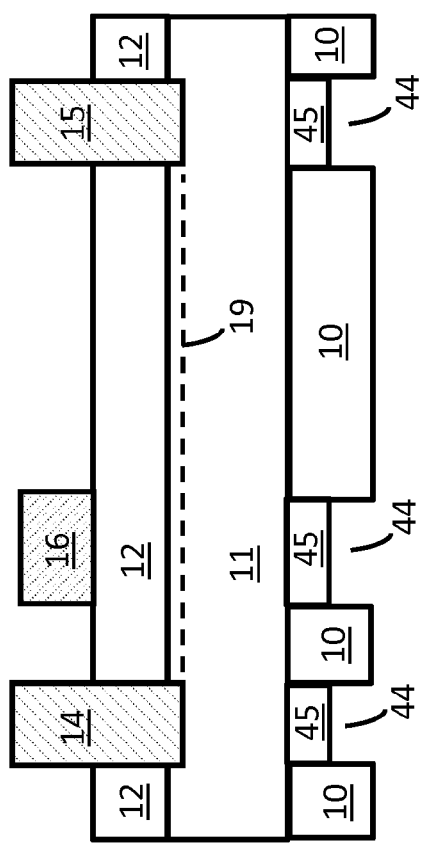
Figure 14:
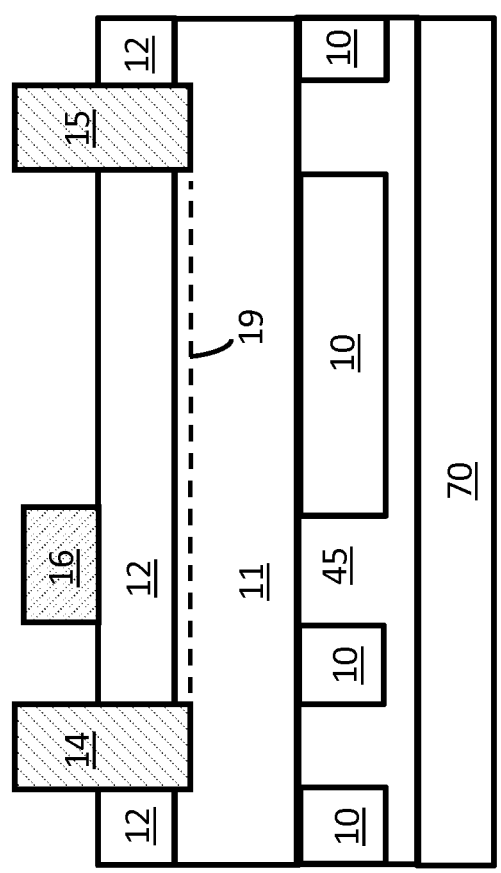

As shown in FIG. 13, a passivation layer 45, such as SiN, is deposited over the exposed surface of channel layer 11 in regions 44 where as-grown substrate 10 has been removed. Passivation layer 45 can be deposited over the exposed surface of channel layer 11 to entirely fill regions 44 where the substrate has been removed, or only partially fill regions 44, and can extend to areas around regions 44. As illustrated in FIG. 14, passivation layer 45 may also cover the remaining portions of the as-grown substrate 10, and in some cases a heat sink 70 is attached to the opposite side of passivation layer 45. The heat sink can serve to further dissipate heat away from the device. Passivation layer 45 can be thick enough, such as between about 0.5 microns and 20 microns, or between about 10 microns and 20 microns, or between 15 microns and 20 microns, to passivate the exposed surfaces of the reverse face of channel layer 11, as well as to support the voltages at which the III-N devices operates. In the case that a heat sink 70 is connected to the opposite side of passivation layer 45, shown in FIG. 14, passivation layer 45 should not be so thick that its thermal conductance is insufficient to dissipate the heat required to operate at substantial operating voltages, which would adversely affect device performance and reliability.

Figure 15:
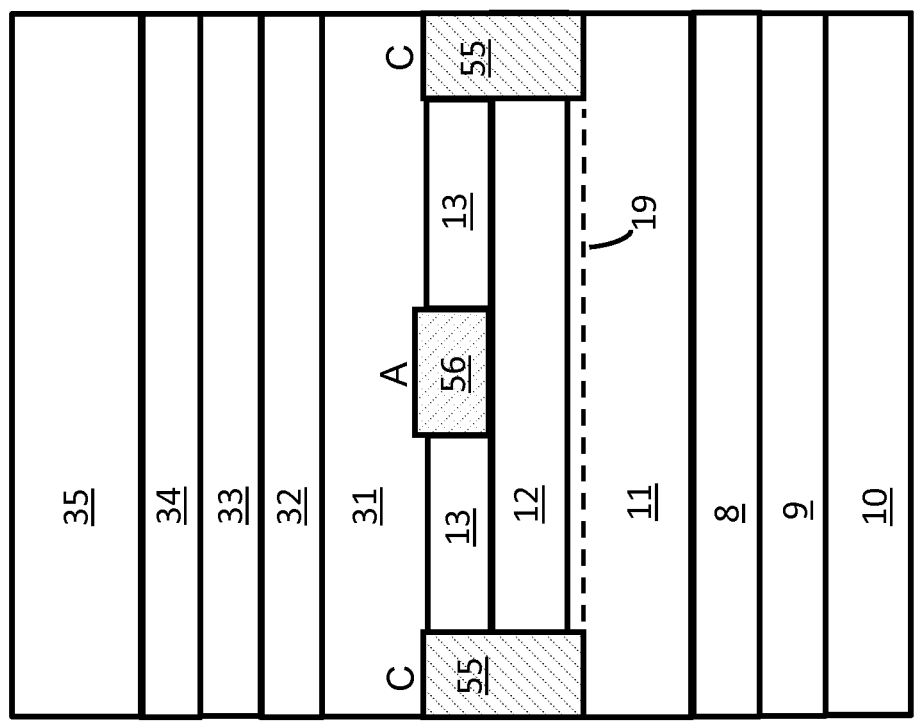
FIG. 15 is a schematic cross-sectional view of a III-N diode containing a dielectric insulating layer, bonding layers, and a thick carrier.

The methods described above for attaching a III-N transistor to a carrier in order to dissipate heat away from the transistor can also be applied to other types of III-N devices. For example, FIG. 15 shows an example of a III-N device structure attached to a carrier 35, where the III-N device is a diode rather than the HEMT device shown in FIG. 2. The diode shown in FIG. 15 includes an anode 56, atop barrier layer 12, and a cathode 55, that contacts the 2 DEG channel 19 in channel layer 11. Cathode 55 shown in FIG. 15 is a single contact (although the cathode 55 looks like multiple contacts in the cross-sectional view shown in FIG. 15, the 2 portions of cathode 55 shown in FIG. 15 are in fact connected). The diode shown in FIG. 15 is a lateral device. Although not shown in FIG. 15, other methods of connecting the carrier 35 to the diode can be used as well. For example, the dielectric insulating layer 31 may be replaced by multiple dielectric layers, as in FIG. 9. The substrate 10, nucleation layer 9, and stress management stack 8 can each be partially or fully removed, as in FIG. 6. When the substrate is removed, the exposed III-N material can be covered by a passivation layer, as in FIG. 7. Vias can be formed through the passivation layer and III-N material to access the anode 56 and cathode 55, and metal contacts can be deposited in the vias, also similarly to the device in FIG. 7. Other diode structures may be used as well.

Other possible additions or modification to the structure of FIG. 11 can include the following. The material of second dielectric insulating layer 42 may be deposited in more than one deposition step, using more than one deposition method. For example, a desired thickness of second dielectric insulating layer 42, such as between about 0.5 to 50 microns, may be deposited over the first dielectric insulating layer 41 by chemical vapor deposition or other technique. Then up to about 10 microns of additional material of a second dielectric insulating layer 41 may be deposited by another method, such as sputtering. A thick insulating carrier 43 can then be attached to the surface of dielectric insulating layer 41 using adhesive layer 42. Other possible additions or modification to the structure of FIG. 12 can include the following. Additional layers may be deposited over portions of passivation layer 45, or over all of passivation layer 45, and these additional layers may not directly contact channel layer 11. For example, a metal may be deposited over passivation layer 45.

It is understood that modifications to the III-N material structure can be made, as long as the resulting structure is one with which a III-N HEMT or other III-N device, such as an HFET, MISHFET, MOSFET, MESFET, JFET, CAVET, POLFET, HEMT, FET, diode, or another device can be formed. For example, the structure may not include the stress management stack 8 or the nucleation layer 9 between the substrate 10 and the overlying III-N layers.

Other features which are well known to be beneficial to device performance can also be included in the structures of FIGS. 6, 10, and 12. Nevertheless, it will be understood that various modifications may be made without departing from the spirit and scope of the techniques and structures described herein. Accordingly, other implementations are within the scope of the following claims.

What is claimed is:
1. A III-N device, comprising:
a III-N layer having an electrode thereon;

a passivation layer adjacent the III-N layer and the electrode;

an insulating layer adjacent the passivation layer and the electrode;

a second dielectric insulating layer between the insulating layer and the passivation layer;

a high thermal conductivity carrier capable of transferring substantial heat away from the III-N device; and a bonding layer between the insulating layer and the high thermal conductivity carrier, the bonding layer attaching the insulating layer to the carrier.

2. The III-N device of claim 1, further comprising a substrate adjacent the III-N layer.

3. The III-N device of claim 2, wherein the substrate is selected from the group consisting of silicon, silicon carbide, sapphire and aluminum nitride.

4. The III-N device of claim 2, further comprising a nucleation layer between the substrate and the III-N layer.

5. The III-N device of claim 4, further comprising a stress management layer between the nucleation layer and the III-N layer.

6. The III-N device of claim 1, wherein the second dielectric insulating layer is selected from the group consisting of silicon nitride, aluminum nitride, silicon oxide, alumina, a polymeric dielectric, and an organic dielectric.

7. The III-N device of claim 1, wherein the second dielectric insulating layer is 0.5-5 microns thick.

8. The III-N device of claim 1, wherein the insulating layer is about 1-50 microns thick.

9. The III-N device of claim 1, wherein the thermal conductivity of the second dielectric insulating layer is less than the thermal conductivity of the insulating layer.

10. A III-N device, comprising:
a III-N layer having an electrode thereon;
a passivation layer adjacent the III-N layer and the electrode;
an insulating layer adjacent the passivation layer and the electrode;
a high thermal conductivity carrier capable of transferring substantial heat away from the III-N device;
a bonding layer between the insulating layer and the high thermal conductivity carrier, the bonding layer attaching the insulating layer to the carrier; and
a second passivation layer on an opposite side of the III-N layer from the electrode, the second passivation layer contacting the III-N layer.

11. The III-N device of claim 10, wherein the insulating layer is selected from the group consisting of silicon nitride, aluminum nitride, silicon oxide, alumina, a polymeric dielectric, and an organic dielectric.

12. The III-N device of claim 10, wherein the insulating layer is polyimide, benzocyclobutene (BCB), SUB, or a combination of these dielectrics.

13. The III-N device of claim 10, wherein the bonding layer is thermally conductive.

14. The III-N device of claim 10, wherein the bonding layer is selected from the group consisting of solder and dielectric glue.

15. The III-N device of claim 10, wherein the passivation layer is selected from the group consisting of silicon nitride, aluminum nitride, silicon dioxide, alumina, a polymeric dielectric, and an organic dielectric.

16. The III-N device of claim 10, wherein the passivation layer and the insulating layer have substantially the same composition.

17. The III-N device of claim 10, wherein the high thermal conductivity carrier is at least 100 microns thick.

18. The III-N device of claim 10, wherein the electrode is a gate and the device is a transistor.

19. The III-N device of claim 18, further comprising a source electrode, a drain electrode, and a channel in the III-N layer, wherein the source electrode and the drain electrode contact the channel.

20. The III-N device of claim 10, wherein the III-N layer comprises a channel layer and a barrier layer.

21. The III-N device of claim 10, wherein the second passivation layer contacts a surface of the III-N layer from which a substrate was removed.

22. A method of making a III-N device comprising:
providing a first structure on a substrate, the first structure comprising a III-N semiconductor layer having an electrode thereon, a passivation layer adjacent the III-N semiconductor layer and the electrode, an insulating layer adjacent the passivation layer and the electrode, a high thermal conductivity carrier capable of transferring substantial heat away from the III-N device, and a bonding layer between the insulating layer and the high thermal conductivity carrier, the bonding layer attaching the insulating layer to the high thermal conductivity carrier;
after providing the first structure on the substrate, removing the substrate to expose a surface of the III-N semiconductor layer; and
forming a second passivation layer on the exposed surface of the III-N semiconductor layer.

* * * * *

UNITED STATES PATENT AND TRADEMARK OFFICE
CERTIFICATE OF CORRECTION

PATENT NO.        : 9,224,671 B2                                    Page 1 of 1
APPLICATION NO.   : 14/522154
DATED             : December 29, 2015
INVENTOR(S)       : Primit Parikh et al.

It is certified that error appears in the above-identified patent and that said Letters Patent is hereby corrected as shown below:

In the Claims:
Column 12, line 6, in claim 12: delete "SUB," and insert --SU8,--, therefor.

Signed and Sealed this
Twenty-third Day of August, 2016

Michelle K. Lee
*Director of the United States Patent and Trademark Office*